United States Patent
Byers et al.

(10) Patent No.: US 7,863,912 B2
(45) Date of Patent: Jan. 4, 2011

(54) CIRCUIT BOARD TESTING SYSTEM USING FREE SPACE OPTICAL COMMUNICATIONS

(75) Inventors: Charles Calvin Byers, Wheaton, IL (US); Thomas B. Cook, Princeton, NJ (US); Bradford Gene Van Treuren, Lambertville, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 0 days.

(21) Appl. No.: 11/998,607

(22) Filed: Nov. 30, 2007

(65) Prior Publication Data

US 2009/0140755 A1 Jun. 4, 2009

(51) Int. Cl.
*G01R 31/304* (2006.01)
(52) U.S. Cl. .................... 324/750; 324/158.1
(58) Field of Classification Search .............. None
See application file for complete search history.

(56) References Cited

U.S. PATENT DOCUMENTS

| | | | | |
|---|---|---|---|---|
| 6,601,007 | B1 * | 7/2003 | Amir et al. ................. | 702/107 |
| 6,863,453 | B2 * | 3/2005 | Wang et al. ................. | 385/94 |
| 7,289,692 | B2 * | 10/2007 | Wasserman et al. ......... | 385/14 |
| 7,412,123 | B1 * | 8/2008 | Mader et al. ............... | 385/14 |
| 2005/0047795 | A1 * | 3/2005 | Windover et al. .......... | 398/164 |
| 2008/0304832 | A1 * | 12/2008 | Williams ................... | 398/131 |

OTHER PUBLICATIONS

Collins, Pete, "Design Considerations in Using 1149.1 as a Backplane Test Bus," JTAG Technologies, [8 pp.—First Version of Two]; downloaded from http://www.molesystems.com/BTW/material/BTW03/BTW03%20Session%206%20Papers/Design%20Considerations%201149%20Backplane%20(6.1).pdf.

Collins, Pete, "Design Considerations in Using 1149.1 As a Backplane Test Bus," JTAG Technologies, [25 pp.—Second Version of Two]; downloaded from http://www.molesystems.com/BTW/material/BTW03/BTW03%20Session%206%20Slides/6-1%20PeteCollins-Slides.pdf.

Lenkisch, Andreas, "ATCA Backplanes," PRAXIS Profiline—AdvancedTCA, 3pp.

"Strategy White Paper, AdvancedTCA—'A common platform concept to improve product engineering'," Alcatel, Jul. 2005, 12 pp.

(Continued)

*Primary Examiner*—Vinh P Nguyen
(74) *Attorney, Agent, or Firm*—Law Office of Jay M. Brown (57) ABSTRACT

System including backplane, and first and second circuit boards. First circuit board is attached to backplane and has first optical signal transmitter. Second circuit board is attached to backplane and has first optical signal receiver. First optical signal transmitter and first optical signal receiver are separated by free space and form optical communication link configured for circuit board test signal communication from first circuit board to second circuit board through the free space. Method includes providing backplane and first and second circuit boards, where first circuit board is attached to backplane and has first optical signal transmitter, and second circuit board is attached to backplane and has first optical signal receiver. First optical signal transmitter and first optical signal receiver are separated by free space, and form optical communication link. Method additionally includes transmitting circuit board test signal from first circuit board to second circuit board through the free space.

23 Claims, 6 Drawing Sheets

OTHER PUBLICATIONS

"AdvancedTCA PICMG 3.0 Short Form Specification," PCI Industrial Computers Manufacturers Group, 34pp.

"JTAG—A technical overview," 6 pp., downloaded from http://www.xjtag.com/support-jtag/jtag-technical-guide.php.

"Advanced Telecommunications Computing Architecture," 5 pp., downloaded from http://en.wikipedia.org/wiki/Advanced_Telecommunications_Computing_Architecture.

"Backplane," 4 pp., downloaded from http://en.wikipedia.org/wiki/Backplane.

Oshana, Rob, "Introduction to JTAG," 5 pp., downloaded from http://www.embedded.com/columns/beginerscorner/9900782?_requestid=23571.

"Application Note, IEEE Standard 1149.1 (JTAG) in the SX/RTSX/SX-A/eX/RT54SX-S Families," 12 pp., Actel Corporation.

"Advanced TCA Tutorial," 87pp, SuperComm, May 23, 2004, downloaded from http://www.picmg.org/v2internal/newinitiative.htm.

* cited by examiner

CIRCUIT BOARD TESTING SYSTEM USING FREE SPACE OPTICAL COMMUNICATIONS

BACKGROUND OF THE INVENTION

1. Field of the Invention

This invention generally relates to systems for testing circuit boards.

2. Related Art

Various types of systems have been developed for testing circuit boards. Circuit boards often include a number of complex components requiring accurate fabrication and accurate assembly into a completed circuit board. Such circuit boards often are then combined into larger systems including a plurality of circuit boards, having even more complexity. Failures of circuit boards in such systems may require time consuming and costly diagnosis of system errors to identify and then either replace or repair a malfunctioning circuit board. Systems have accordingly been developed for testing circuit boards during and after their manufacture. Despite these developments, there is a continuing need for new systems that are capable of carrying out testing of systems that include a plurality of circuit boards.

SUMMARY

In an example of an implementation, a system is provided, including a backplane, a first circuit board, and a second circuit board. The first circuit board is attached to the backplane and had a first optical signal transmitter. The second circuit board is attached to the backplane and has a first optical signal receiver. The first optical signal transmitter and the first optical signal receiver are separated by free space and form an optical communication link configured for circuit board test signal communication from the first circuit board to the second circuit board through the free space.

In an additional example of an implementation, a method is provided, including providing a backplane, a first circuit board, and a second circuit board. The first circuit board is attached to the backplane and has a first optical signal transmitter, and the second circuit board is attached to the backplane and has a first optical signal receiver. The first optical signal transmitter and the first optical signal receiver are separated by free space, and form an optical communication link. The method additionally includes transmitting a circuit board test signal from the first circuit board to the second circuit board through the free space.

Other systems, methods, features and advantages of the invention will be or will become apparent to one with skill in the art upon examination of the following figures and detailed description. It is intended that all such additional systems, methods,, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

DETAILED DESCRIPTION

Some systems for testing circuit boards rely on establishing electronic communication pathways to components onboard a circuit board through a backplane to which the circuit board is connected by a circuit board connector. Such a circuit board connector may include a first connector member having an array of connector pins, configured for mating attachment with a second connector member having a corresponding array of connector apertures. One of the first and second connector members may be structurally and electronically integrated with the backplane, and the other of the connector members may be structurally and electronically integrated with a circuit board. The backplane may then provide electronic communication pathways through the backplane into and out of the circuit board. However, some of these systems for testing circuit boards may not include adequate numbers of connector pin and aperture mating pairs available for utilization in testing a circuit board and having sufficient collective bandwidth and effective data transfer speed for practically carrying out circuit board testing. As examples, backplanes conforming to a PCI Industrial Computer Manufacturers Group standard such as the Advanced Telecommunications Computing Architecture ("AdvancedTCA") or the Micro Telecommunications Computing Architecture ("MicroTCA") may suffer from this inadequacy. As examples, an inadequacy of connector pin and aperture mating pairs available for utilization in testing a circuit board may lead to problems including slow testing of circuit boards resulting in an excessive time to completion, limited feasibility of high volume circuit board testing, or an inability to practically carry out a full test protocol on a circuit board. Accordingly, systems and methods described herein may provide interconnection pathways for circuit board test signals to and between circuit boards, including optical communication links across free space. These systems and methods may facilitate improved quality of circuit board testing, reduced testing time, and capability for high volume testing of circuit boards.

Figure 1:
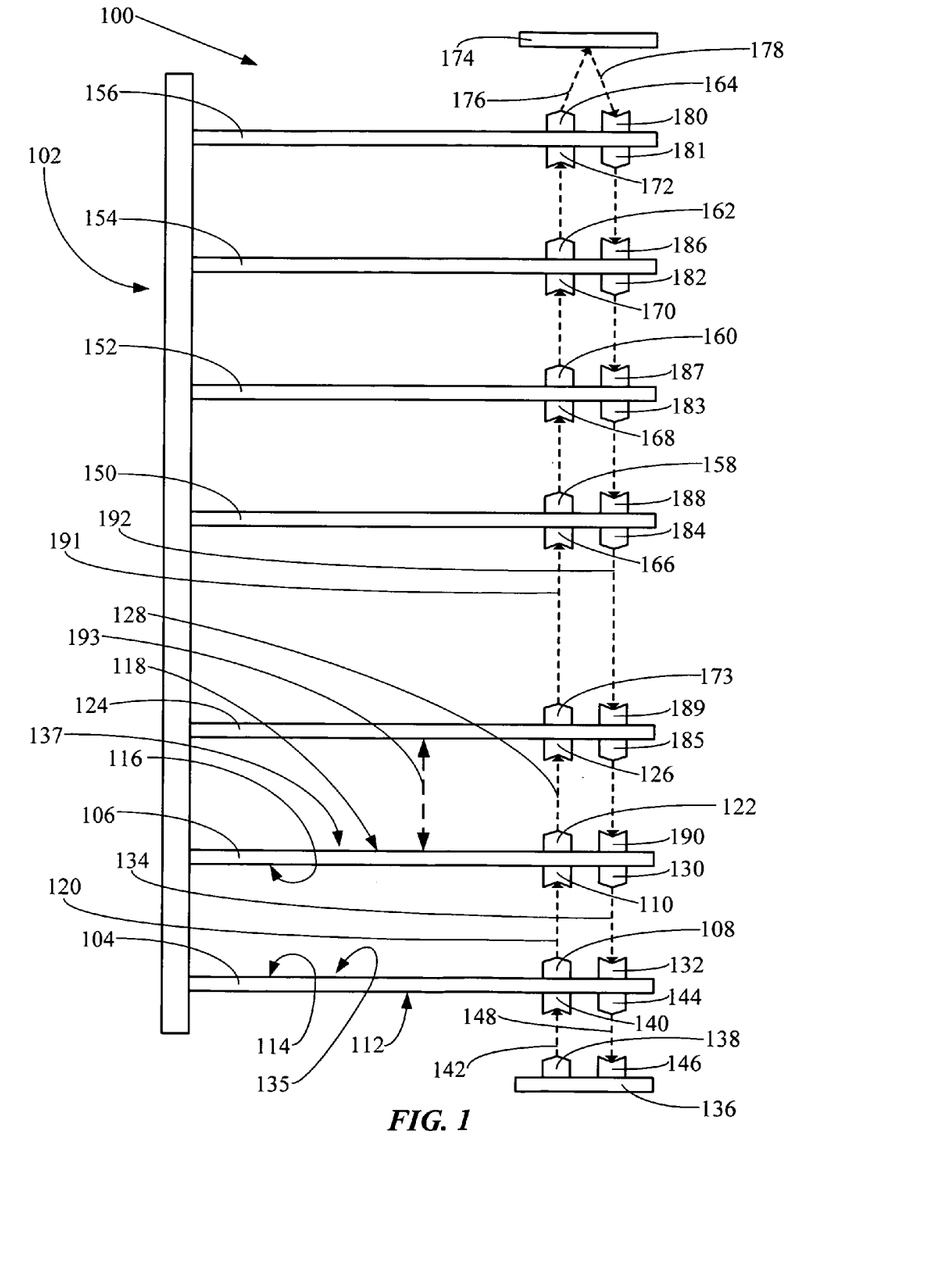
FIG. 1 is a schematic view showing an example of an implementation of a system including a backplane, a first circuit board, and a second circuit board.

FIG. 1 is a schematic view showing an example of an implementation of a system 100 including a circuit board backplane 102, a first circuit board 104, and a second circuit board 106. The first circuit board 104 is attached to the backplane 102 and has a first optical signal transmitter 108. The second circuit board 106 is attached to the backplane 102 and has a first optical signal receiver 110.

It is understood throughout this specification by those skilled in the art that the term "backplane" designates a circuit board having a plurality of circuit board connector members (not shown), the backplane serving as a "backbone" for the attachment of a plurality of circuit boards 104, 106 at the circuit board connector members. As an example, each of the circuit board connector members included in the backplane may have an array of female connector apertures configured for receiving and forming electrical connections with a corresponding array of male connector pins included in circuit board connector members of each of the circuit boards 104, 106. As another example, each of the circuit board connector members included in the backplane may have an array of male connector pins configured for being received by and forming electrical connections with a circuit board connector member having a corresponding array of female connector apertures included in each of the circuit boards 104, 106. As an example, a backplane may include a plurality of such circuit board connector members that are connected by the backplane in parallel to each other, so that all of the male connector pins or female connector apertures at a given position in each of the circuit board connector members are linked in parallel. In this example, a backplane may serve as a communication cross-connect for an attached plurality of circuit boards 104, 106. For example, the backplane may form a mesh or dual star network. It is further understood throughout this specification by those skilled in the art that a backplane may include further components including active and passive microelectronic components, optical fiber interconnects, and other features. It is understood throughout this specification by those skilled in the art that a backplane may utilize any circuit board connector members suitable for connecting circuit boards 104, 106 to the backplane. As an example, the backplane may conform to a PCI Industrial Computer Manufacturers Group standard such as the Advanced Telecommunications Computing Architecture or the Micro Telecommunications Computing Architecture.

Figure 2:
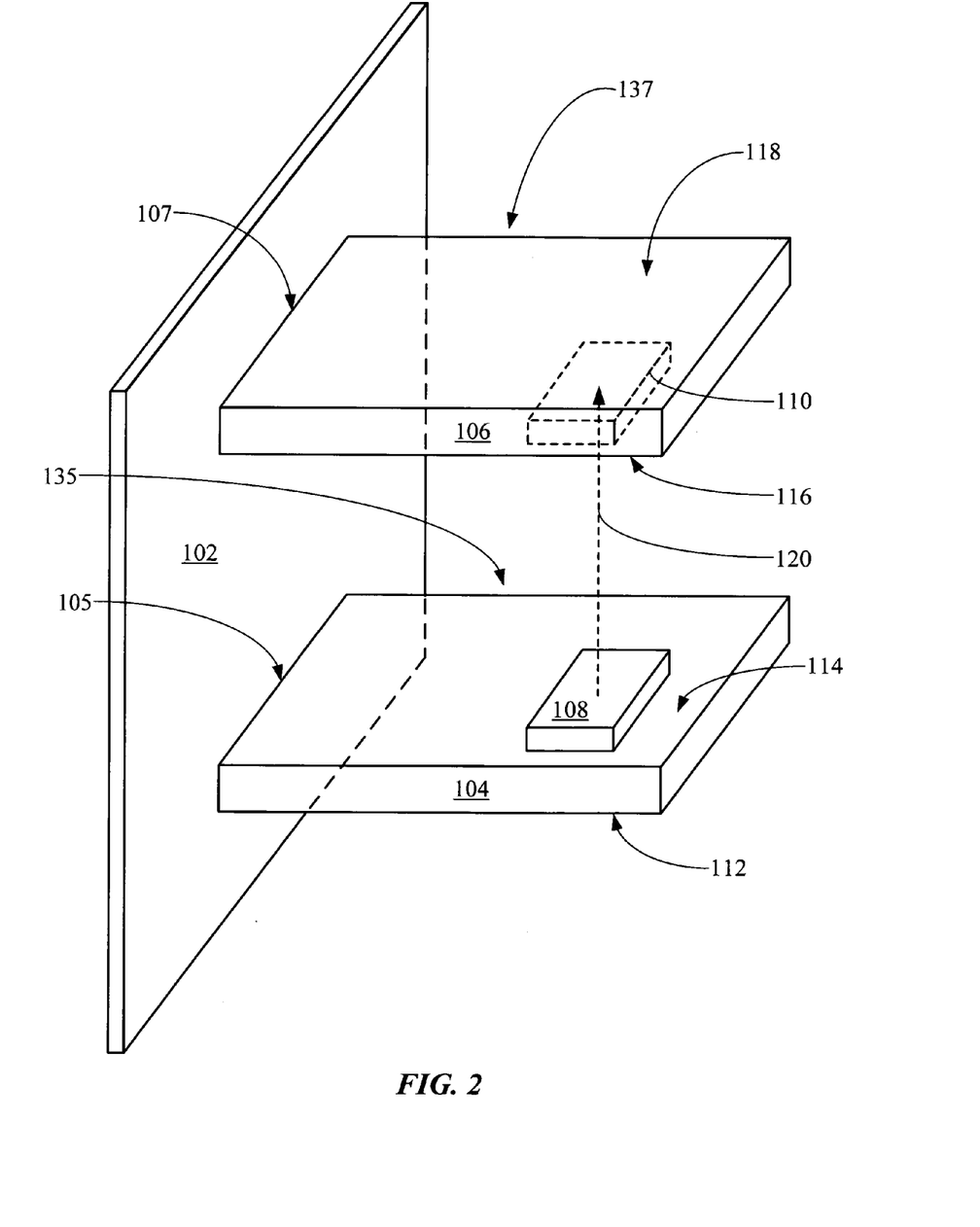
FIG. 2 is a perspective view of the first and second circuit boards, and a part of the backplane, shown in FIG. 1.

FIG. 2 is a perspective view of the first and second circuit boards 104, 106, and a part of the backplane 102, shown in FIG. 1. The first and second circuit boards 104, 106 may be attached to the backplane 102, for example, by circuit board connector members (not shown) at joints 105, 107 respectively. Each of the first and second circuit boards 104, 106 may, for example, have a rectangular wafer shape including two generally planar surfaces on opposite sides of the wafer, with electronic and other components (not shown) being on either one or both of the generally planar surfaces. For example, the first circuit board 104 may have a rectangular wafer shape as schematically shown in FIGS. 1 and 2, including two generally planar surfaces indicated by the arrows 112, 114 on opposite sides of the wafer. Further for example, the second circuit board 106 may have a rectangular wafer shape as schematically shown in FIGS. 1 and 2, including two generally planar surfaces indicated by the arrows 116, 118 on opposite sides of the wafer. It is understood throughout this specification by those skilled in the art that when a component is referred to as being "on" a generally planar surface 112, 114, 116, 118 of a circuit board 104, 106, that component may be directly on the generally planar surface 112, 114, 116, 118 or alternatively, there may be one or more additional components between that component and the generally planar surface 112, 114, 116, 118.

In an example, each of the first and second circuit boards 104, 106 may have dimensions that are compatible with a backplane 102 that is itself compliant with a PCI Industrial Computer Manufacturers Group standard such as the Advanced Telecommunications Computing Architecture or the Micro Telecommunications Computing Architecture.

The first optical signal transmitter 108 may be mounted on the generally planar surface, indicated by the arrow 114, of the first circuit board 104. The first optical signal receiver 110 may be mounted on the generally planar surface, indicated by the arrow 116, of the second circuit board 106. The first optical signal transmitter 108 and the first optical signal receiver 110 are mutually configured and mutually aligned on an optical communication link represented by the arrow 120 for circuit board test signal communication from the first circuit board 104 to the second circuit board 106 across free space. In an example, the first optical signal transmitter 108 may be in electrical signal communication with the first circuit board 104, and the first optical signal receiver 110 may be in electrical signal communication with the second circuit board 106.

In an example, the second circuit board 106 may include a second optical signal transmitter 122, the system 100 having a third circuit board 124 attached to the backplane 102 and including a second optical signal receiver 126, where the second optical signal transmitter 122 and the second optical signal receiver 126 are mutually configured and mutually aligned for circuit board test signal communication from the second circuit board 106 to the third circuit board 124 across free space on an optical communication link represented by the arrows 128. As a further example, the second circuit board 106 may include a third optical signal transmitter 130 and the first circuit board 104 may include a third optical signal receiver 132, where the third optical signal transmitter 130 and the third optical signal receiver 132 are mutually configured and mutually aligned for circuit board test signal communication from the second circuit board 106 to the first circuit board 104 across free space on an optical communication link represented by the arrow 134. The optical communication links represented by the arrows 120 and 134 between circuit boards 104 and 106 function in opposite directions, permitting the establishment of bidirectional communications between circuit boards 104 and 106. The direction of the optical communication link represented by the arrow 120 may be designated as a forward direction in the system 100, and the direction of the optical communication link represented by the arrow 134 may be designated as a return direction in the system 100.

The first circuit board 104 may, as an example, include a first circuit board test circuit 135 configured to be in circuit board test signal communication with the first optical signal transmitter 108 and with the third optical signal receiver 132, and configured for testing the first circuit board 104. The second circuit board 106 may, as an example, include a second circuit board test circuit 137 configured to be in circuit board test signal communication with the first optical signal receiver 110 and with the second and third optical signal transmitters 122, 130, and configured for testing the second circuit board 106. The first and second circuit board test circuits 135, 137 may support boundary scan testing of the first and second circuit boards 104, 106, respectively. As an example, the first and second circuit board test circuits 135, 137 may emulate the boundary scan control signal ports, referred to as the Test Access Port ("TAP") of the typical IEEE Standard 1149.1 Boundary Scan test signals including TDI, TDO, TMS, TRST and TCK, commonly referred to in the industry as the Joint Test Access Group ("JTAG") standard for boundary scan testing of circuit boards.

For example, the system 100 may include a circuit board test control device 136 configured to be in circuit board test signal communication with the first circuit board test circuit 135 that may be included in the first circuit board 104. The circuit board test control device 136 may be configured for bypassing the backplane 102 in communicating with the first circuit board 104. As an example, the circuit board test control device 136 may include a fourth optical signal transmitter 138, and the first circuit board 104 may include a fourth optical signal receiver 140. The fourth optical signal transmitter 138 and the fourth optical signal receiver 140 may be mutually configured and mutually aligned for circuit board test signal communication from the circuit board test control device 136 to the first circuit board 104 across free space on an optical communication link represented by the arrow 142. In another example, the first circuit board 104 may include a fifth optical signal transmitter 144 and the circuit board test control device 136 may include a fifth optical signal receiver 146. The fifth optical signal transmitter 144 and the fifth optical signal receiver 146 may be mutually configured and mutually aligned for circuit board test signal communication from the first circuit board 104 to the circuit board test control device 136 across free space on an optical communication link represented by the arrow 148.

As an example, the circuit board test control device 136 may be in direct circuit board test signal communication with the first circuit board 104 across free space on the optical communication links represented by the arrows 142 and 148, and in indirect circuit board test signal communication with the second circuit board 106 through the first circuit board 104. For example, the circuit board test control device 136 may transmit circuit board test signals from the fourth optical signal transmitter 138 across free space to the first circuit board 104 on the optical communication link represented by the arrow 142, which may then be received by the fourth optical signal receiver 140. The first circuit board 104 may process the circuit board test signals, and then the first circuit board 104 may transmit the circuit board test signals from the first optical signal transmitter 108 across free space to the second circuit board 106 on the optical communication link represented by the arrow 120. Further, as an example, the second circuit board 106 may transmit circuit board test signals from the third optical signal transmitter 130 across free space to the first circuit board 104 on the optical communication link represented by the arrow 134, which may then be received by the third optical signal receiver 132. The first circuit board 104 may further process the circuit board test signals, and then the first circuit board 104 may transmit the circuit board test signals from the fifth optical signal transmitter 144 across free space to the circuit board test control device 136 on the optical communication link represented by the arrow 148. Processing of the circuit board test signals in the first and second circuit boards 104, 106 may include, as examples, sending circuit board test signals through parts of a circuit board 104, 106 to provide a test stimulus generating a test output signal for analysis by the circuit board test control device 136, storing circuit board test signals in a circuit board 104, 106, deleting a part of a circuit board test signal, and routing all or a part of a circuit board test signal from one circuit board 104 to another circuit board 106 in the system 100. All or part of a circuit board test signal may be routed, for example, in either the forward or return direction in the system 100.

In examples, the circuit board test control device 136 may be temporarily or permanently placed in alignment with the first circuit board 104 as shown in FIGS. 1-2. As an example, the backplane 102 may be mechanically attached to a shelf in a chassis (not shown) for the backplane 102. Further, for example, the circuit board test control device 136 may be mechanically attached to a circuit board shelf in the chassis, suitably aligned with respect to the backplane 102 and the first circuit board 104. The chassis may be, as examples, an AdvancedTCA chassis or a MicroTCA chassis.

The system 100 may, for example, include additional circuit boards attached to the backplane 102, such as circuit boards 150, 152, 154, 156. As an example, the circuit boards 150, 152, 154, 156 may respectively include optical signal transmitters 158, 160, 162, 164, and optical signal receivers 166, 168, 170, 172. The third circuit board 124 may include optical signal transmitter 173. In another example, the system 100 may include a total of sixteen circuit boards (not shown) mutually aligned and attached to the backplane 102 in the same manner as shown in FIGS. 1 and 2 with regard to the circuit boards 104, 106, 124, 150, 152, 154, 156. As further examples, the system 100 may include only the circuit boards 104 and 106, or only the circuit boards 104, 106 and 124, or a selected total number of circuit boards (not shown) that may include two, three, four or more circuit boards up to sixteen or more circuit boards.

A given example of a system 100 may include a light signal redirecting device 174 adjacent to a circuit board 104, 106, 124, 150, 152, 154, 156 attached to the backplane 102 and farthest away in the forward direction among a plurality of attached circuit boards 104, 106, 124, 150, 152, 154, 156 from a position for a circuit board test control device 136. The light signal redirecting device 174 may be configured and aligned for redirecting light, emitted from an optical signal transmitter 122, 173, 158, 160, 162, 164 in the farthest away circuit board 106, 124, 150, 152, 154, 156, toward the circuit board test control device 136. For example, the system 100 shown in FIG. 1 may include such a light signal redirecting device 174 adjacent to the circuit board 156. Light emitted by the optical signal transmitter 164 may be redirected by the light signal redirecting device 174 as represented by the arrows 176, 178 to an optical signal receiver 180 on the circuit board 156. Further optical signal transmitters 181, 182, 183, 184, 185, 130, 144 and optical signal receivers 186, 187, 188, 189, 190, 132, 146 may then return the redirected light in the return direction to the circuit board test control device 136. The light signal redirecting device 174 may, as examples, include (not shown), a mirror, or two 45 degree mirrors, or retro-reflectors, in each example being suitably configured for redirecting light emitted from the optical signal transmitter 164 to the optical signal receiver 180. In another example, the light signal redirecting device 174 may include an optical signal receiver (not shown) configured and aligned to detect light emitted by the optical signal transmitter 164. The light signal redirecting device 174 may further include, for example, an optical signal transmitter (not shown) configured for directing light to the optical signal receiver 180.

The first optical signal transmitter 108 may include, for example, a light source, a controller for the light source configured to modulate an intensity of the light source in response to commands received from the first circuit board test circuit 135 in the first circuit board 104, and optical components (not shown) such as lenses, suitable to form and direct a light beam substantially in the forward direction along the optical communication link represented by the arrow 120. As examples, the light source may include a laser, a light emitting diode ("LED"), or another optical source. The first optical signal receiver 110 may include, for example (not shown), optical components configured for collecting and receiving light traveling on the optical communication link represented by the arrow 120, an optical transducer for converting the light into an electrical signal, and an electrical signal conditioning circuit configured for driving the received circuit board test signals to the second circuit board test circuit 137 in the second circuit board 106. The optical components configured for collecting and receiving light may include lenses, as an example. The optical transducer may include a photodiode or another photo-detector, as examples. The electrical signal conditioning circuit may include a trans-impedance amplifier, as an example. The first optical signal transmitter 108 may, in an example, emit light having a selected wavelength or range of wavelengths. The first optical signal receiver 110 may, as another example, be configured for selectively detecting a wavelength or range of wavelengths of light emitted by the first optical signal transmitter 108. As examples, a wavelength or a plurality or range of wavelengths of visible or infrared light may be utilized. The first optical signal transmitter 108 may, as a further example, emit light in a beam configured for effective detection by the first optical signal receiver 110 across the optical communication link represented by the arrow 120. For example, the first optical signal transmitter 108 may be configured to emit light in a beam that spreads adequately over the optical communication link represented by the arrow 120 so that the first optical signal receiver 110 may effectively detect the emitted light beam in spite of inaccuracies in mutual alignment of the first optical signal transmitter and receiver 108, 110 that may occur. As another example, the first optical signal transmitter 108 may be configured to emit light in a beam having sufficient intensity, so that sufficient beam intensity remains after the light beam travels across the optical communication link represented by the arrow 120. In that manner, the first optical signal receiver 110 may effectively detect the emitted light beam in spite of attenuation of the beam intensity, which may be due in part to beam spreading.

In an example where a backplane 102 may be utilized conforming to the Advanced Telecommunications Computing Architecture, the distance to be traversed from a optical signal transmitter to an optical signal receiver in the system 100, such as the optical communication link represented by the arrow 120, may be within a range of between about 25 millimeters ("mm") and about 900 mm. In another example where a backplane 102 may be utilized conforming to the Micro Telecommunications Computing Architecture, the distance to be traversed from an optical signal transmitter to an optical signal receiver in the system 100, such as the optical communication link represented by the arrow 120, may be within a range of between about 10 mm and about 900 mm. The first optical signal transmitter 108 may be configured, for example, to emit a substantially collimated beam. A substantially collimated beam may be defined, for example, as a beam emitted from a lens having an aperture diameter within a range of between about two (2) and about ten (10) mm, the beam having a divergence within a range of between about one (1) and about ten (10) degrees. The above discussion with respect to the first optical signal transmitter 108 may also apply to any additional optical signal transmitters 122, 130, 138, 144, 158, 160, 162, 164, 173, 181, 182, 183, 184, 185 included in an example of a system 100. The above discussion with respect to the first optical signal receiver 110 may also apply to any additional optical signal receivers 126, 132, 140, 146, 166, 168, 170, 172, 180, 186, 187, 188, 189, 190 included in an example of a system 100.

In a further example, a pair of circuit boards 124, 150 may respectively include optical signal transmitters 173, 184 and may respectively include optical signal receivers 166, 189, separated by optical communication links represented respectively by arrows 191, 192. The length of the optical communication link represented by the arrow 191 may be larger, for example, than the length of the optical communication link represented by the arrow 120 between the first optical signal transmitter 108 and the first optical signal receiver 110. Likewise, the length of the optical communication link represented by the arrow 192 may be larger, for example, than the length of the optical communication link represented by the arrow 134 between the third optical signal transmitter 130 and the third optical signal receiver 132. The lengths of the optical communication links represented by the arrows 191, 192 may be larger than the lengths of the optical communication links represented by the arrows 120, 134, for example, as a result of omission of one or more circuit boards (not shown) from one or more circuit board connector members (not shown) positioned in the backplane 102 at locations between the third circuit board 124 and the circuit board 150. However, the system 100 may be nevertheless capable of functioning to transmit and receive circuit board test signals over the optical communication links represented by the arrows 191, 192. As another example, the system 100 may include a double-wide circuit board (not shown) attached to the backplane 102. Such a double-wide circuit board may, for example, occupy space in the system 100 spanning a distance represented by an arrow 193 between the circuit boards 106, 124. Inclusion of such a double-wide circuit board in the system 100 may lead to, for example, a need for transmission of a circuit board test control signal over a distance larger than the lengths of the optical communication links represented by the arrows 120, 134.

In an example of operation of the system 100, a circuit board test control device 136 may be secured in position with respect to the first circuit board 104 as shown in FIG. 1. It is understood throughout this specification by those skilled in the art that a circuit board test control device 136 implementing test control logic conforming to a selected industry standard, for example, may be utilized. As an example, test control logic conforming to the JTAG standard may be selected. The circuit board test control device 136 may then be energized and placed in circuit board test signal communication with the circuit boards 104, 106, 124, 150, 152, 154, 156 via the optical signal transmitter 138 and the optical signal receiver 146 as earlier discussed. The selected test control logic implemented by the circuit board test control device 136 may, for example, control the application of circuit board test signals to first and second circuit board test circuits 135, 137 respectively in the first and second circuit boards 104, 106, and to further circuit board test circuits (not shown) in the circuit boards 124, 150, 152, 154, 156. As an example, the test control logic may implement a circuit board level scan chain for testing each of the circuit boards 104, 106, 124, 150, 152, 154, 156 in the system 100. As another example, the test control logic may emulate the serial boundary scanning protocol of the JTAG standard, also known as the TAP. The TAP may include five signals: Test Clock ("TCK"), Test Mode Select ("TMS"), Test Data In ("TDI"), Test Data Out ("TDO"), and Test Reset ("TRST"). The TCK, TMS and TRST signals derive a 16-state TAP controller. The TAP controller manages the exchange of test data and instructions. The TAP controller advances to a next test state based on the values of the TMS signal at each rising edge of the TCK signal.

Configuration Example. The following paragraphs discuss an example of a configuration (not shown) of a system 100. In this configuration example, the test control logic implemented by the system 100 may emulate the serial boundary scanning protocol of the JTAG standard, also known as the TAP. In this configuration example, the circuit board test control device 136 may transmit circuit board test signals from the fourth optical signal transmitter 138 across free space to the first circuit board 104 on the optical communication link represented by the arrow 142, which may then be received by the fourth optical signal receiver 140. The first circuit board 104 may process the received circuit board test signals, and then the first circuit board 104 may transmit circuit board test signals from the first optical signal transmitter 108 across free space to the second circuit board 106 on the optical communication link represented by the arrow 120. Further in this configuration example, the second circuit board 106 may transmit circuit board test signals from the third optical signal transmitter 130 across free space to the first circuit board 104 on the optical communication link represented by the arrow 134, which may then be received by the third optical signal receiver 132. The first circuit board 104 may process the circuit board test signals, and then the first circuit board 104 may transmit the circuit board test signals from the fifth optical signal transmitter 144 across free space to the circuit board test control device 136 on the optical communication link represented by the arrow 148.

The second circuit board 106 may further include the second optical signal transmitter 122, and the optical signal receiver 190. After processing in the second circuit board 106, the circuit board test signals may be transmitted from the second optical signal transmitter 122 through the circuit boards 124, 150, 152, 154, 156 in the forward direction for processing in an analogous manner, and received in the return direction by the optical signal receiver 190 in the second circuit board 106. The second circuit board 106 may then again process the received circuit board test signals in an analogous manner, and then the second circuit board 106 may transmit circuit board test signals from the third optical signal transmitter 130 as discussed above.

Further in this configuration example, the first circuit board 104 may include optical signal transmitters 108, 144, and optical signal receivers 132, 140. The fourth optical signal receiver 140 may include an optical transducer (not shown) for converting received optical circuit board test signals into electrical signals. The fourth optical signal receiver 140 may also have a first optical interface (not shown) of the first circuit board 104, including an electrical signal conditioning circuit configured for driving the converted electrical circuit board test signals to the first circuit board test circuit 135 for processing in the first circuit board 104. Processing the circuit board test signals in the first circuit board 104 may include, as examples, sending test stimulus signals through parts of the first circuit board 104 to generate a test output signal for return to and analysis by the circuit board test control device 136, storing circuit board test signals in the first circuit board 104, deleting a part of a circuit board test signal, and forwarding all or a part of a circuit board test signal from the first circuit board 104 to the second circuit board 106 or to another destination such as to another circuit board 124 150, 152, 154, 156 or to the circuit board test control device 136. Logic in the test controller may determine whether a particular message in a circuit board test signal should be transmitted out of the first optical interface in the forward direction or the return address. Further, for example, the first circuit board 104 may include (not shown) a local test controller running the JTAG state machine. The JTAG state machine may be implemented, for example, by a field-programmable gate array ("FPGA") on the first circuit board 104. The local test controller may have a JTAG input port interface and a JTAG output port interface. The first circuit board 104 may have (not shown) circuitry for designating a numbered address, among a plurality of numbered circuit board connector members, by which the first circuit board 104 is attached to the backplane 102.

Additionally in this configuration example, the fifth optical signal transmitter 144 may have a second optical interface (not shown) of the first circuit board 104, including an electrical signal conditioning circuit for carrying out any conversion of the electrical circuit board test signals that may be needed for their transmission as light signals by the fifth optical signal transmitter 144.

Further in this configuration example, the third optical signal receiver 132 may include an optical transducer (not shown) for converting received optical circuit board test signals into electrical signals. The third optical signal receiver 132 may also include a third optical interface (not shown) of the first circuit board 104, including an electrical signal conditioning circuit configured for driving the converted electrical circuit board test signals to the first circuit board test circuit 135 for processing in the first circuit board 104.

Also in this configuration example, the first optical signal transmitter 108 may have a fourth optical interface (not shown) of the first circuit board 104, including an electrical signal conditioning circuit for carrying out any conversion of the electrical circuit board test signals that may be needed for their transmission as light signals by the first optical signal transmitter 108.

The first and fifth optical signal transmitters 108, 144 may each include a light source, and may each include a controller for the light source that is configured to modulate an intensity of the light source in response to commands received from the first circuit board test circuit 135.

In addition in this configuration example, the JTAG input and output port interfaces may be integrated into circuitry on the first circuit board 104 configured for processing inputs to and outputs from the first, second, third and fourth optical interfaces through the circuit board level scan chains of the JTAG protocol, utilizing the typical IEEE Standard 1149.1 Boundary Scan test signals including TDI, TDO, TMS, TRST and MCK, commonly referred to in the industry as the JTAG standard. For example, the JTAG state machine may control the JTAG input and output port interfaces and the first, second, third and fourth optical interfaces on the first circuit board 104. In this same configuration example, the JTAG input and output interfaces and the first, second, third and fourth optical interfaces (not shown) of the first circuit board 104, may collectively define routing pathways for circuit board test signals into, through, and out of the first circuit board 104. The addressing of circuit board test signals into, through and out of the first circuit board 104 on these routing pathways may further be controlled by a routing function. The routing function may address pathways for data packets included in the circuit board test data. Further, the routing function may utilize data packet headers for determining destinations for packet routing.

In this configuration example, the routing function may operate in a broadcast mode linking together the four optical interfaces, the JTAG input and output ports, and the JTAG state machine of the first circuit board 104 by routing all incoming circuit board test signal data from the third and fourth optical signal receivers 132, 140 and sending the data via the JTAG input interface to the local JTAG logic. The routing function may also route all incoming circuit board test signal data from the third and fourth optical signal receivers 132, 140 together with all circuit board test signal data outbound from the local JTAG logic via the JTAG output interface, to the first and fifth optical signal transmitters 108, 144.

Alternatively in this configuration example, the routing function may operate in a multi-drop mode by linking together the four optical interfaces, the JTAG input and output ports, and the JTAG state machine of the first circuit board 104 by intercepting the third and fourth optical signal receivers 132, 140, all incoming circuit board test signal data addressed to the first circuit board 104, and selectively sending that data via the JTAG input interface to the local JTAG logic in the first circuit board 104. The routing function may also selectively forward circuit board test data addressed to another circuit board 106, 124, 150, 152, 154, 156, for appropriate routing via the first or fifth optical signal transmitter 108, 144. Since the first circuit board 104 in this configuration example includes two optical signal transmitters 108, 144 and two optical signal receivers 132, 140, this alternative routing function may enable the first circuit board 104 to function as a test signal router. For example, the local test controller in the first circuit board 104 running the JTAG state machine may route test commands addressed to the circuit board 104, to its local JTAG logic. Further, the local test controller in the first circuit board 104 may selectively route to another circuit board 106, 124, 150, 152, 154, 156, any test command addressed to the JTAG logic on that other circuit board. For example, the system 100 in this configuration example may implement scan chains that test functions of a series of circuit boards 104, 106, 124, 150, 152, 154, 156 in an order different than an order in which the circuit boards are attached to the backplane 102.

This same configuration example may further include configuring each of the other circuit boards 106, 124, 150, 152, 154, 156 in the system 100 in a manner similar to that as described for the first circuit board 104.

Figure 3:
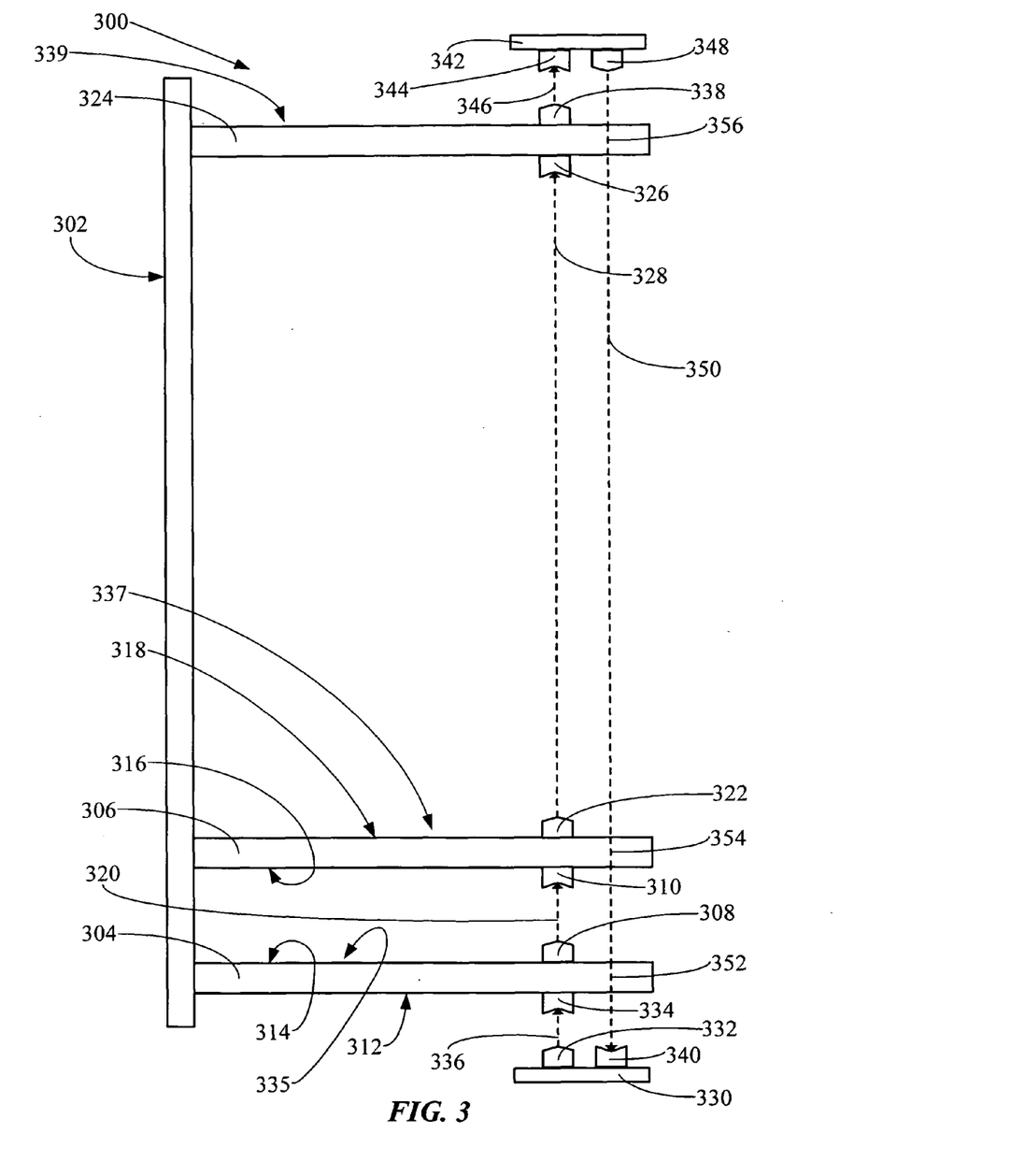
FIG. 3 is a schematic view showing an example of another system including a backplane, a first circuit board, and a second circuit board.

FIG. 3 is a schematic view showing an example 300 of another system including a backplane 302, a first circuit board 304, and a second circuit board 306. The first circuit board 304 is attached to the backplane 302 and has a first optical signal transmitter 308. The second circuit board 306 is attached to the backplane 302 and has a first optical signal receiver 310. The first circuit board 304 may have a rectangular wafer shape in the same manner as earlier discussed with regard to the first circuit board 104, including two generally planar surfaces indicated by the arrows 312, 314 on opposite sides of the wafer. Further for example, the second circuit board 306 may have a rectangular wafer shape in the same manner as earlier discussed with regard to the circuit board 106, including two generally planar surfaces indicated by arrows 316, 318 on opposite sides of the wafer. In an example, each of the first and second circuit boards 304, 306 may have dimensions that are compatible with a backplane 302 that is itself compliant with a PCI Industrial Computer Manufacturers Group standard such as the Advanced Telecommunications Computing Architecture or the Micro Telecommunications Computing Architecture.

The first optical signal transmitter 308 may be mounted on the generally planar surface, indicated by the arrow 314, of the first circuit board 304. The first optical signal receiver 310 may be mounted on the generally planar surface, indicated by the arrow 316, of the second circuit board 306. The first optical signal transmitter 307 and the first optical signal receiver 310 are mutually configured and mutually aligned on an optical communication link represented by the arrow 320 for circuit board test signal communication from the first circuit board 304 to the second circuit board 306 across free space. In an example, the first optical signal transmitter 308 may be in the electrical signal communication with the first circuit board 304, and the first optical signal receiver 310 may be in electrical signal communication with the second circuit board 306.

The second circuit board 306 may include a second optical signal transmitter 322, the system 300 having a third circuit board 324 attached to the backplane 302 and including a second optical signal receiver 326, where the second optical signal transmitter 322 and the second optical signal receiver 326 are mutually configured and mutually aligned on an optical communication link in a forward direction represented by the arrow 328 for circuit board test signal communication from the second circuit board 306 to the third circuit board 324 across free space.

The first circuit board 304 may, as an example, include a first circuit board test circuit 335 configured to be in circuit board test signal communication with the first optical signal transmitter 308 and configured for testing the first circuit board 304. The second circuit board 306 may, as an example, include a second circuit board test circuit 337 configured to be in circuit board test signal communication with the first optical signal receiver 310 and configured for testing the second circuit board 306. The third circuit board 324 may, as an example, include a third circuit board test circuit 339 configured to be in circuit board test signal communication with the second optical signal receiver 326 and configured for testing the third circuit board 324. The first, second, and third circuit board test circuits 335, 337, 339 may support boundary scan testing of the first, second, and third circuit boards 304, 306, 324, respectively.

The system 300 may, for example, include a circuit board test control device 330 configured to be in circuit board test signal communication with the first, second, and third circuit board test circuits 335, 337, 339 that may respectively be included in the first, second, and third circuit boards 304, 306, 324. The circuit board test control device 330 may be configured for bypassing the backplane 302 in communicating with the first, second and third circuit boards 304, 306, 324. As an example, the circuit board test control device 330 may include an optical signal transmitter 332, and the first circuit board 303 may include an optical signal receiver 334. The optical signal transmitter 332 and the optical signal receiver 334 may be mutually configured and mutually aligned on an optical communication link represented by the arrow 336 for circuit board test signal communication from the circuit board test control device 330 to the first circuit board 304 across free space.

As another example, the third circuit board 324 may include an optical signal transmitter 338. In a further example, the circuit board test control device 330 may include an optical signal receiver 340. The system 300 may include a light signal redirecting device 342 adjacent to the third circuit board 324. As an example, the light signal redirecting device 342 may be mechanically attached to a chassis (not shown) for the backplane 302. Further, for example, the light signal redirecting device 342 may be mechanically attached to a circuit board shelf in the chassis, suitably aligned with respect to the backplane 302 and the third circuit board 324. The chassis may be, as examples, an AdvancedTCA chassis or a MicroTCA chassis. As shown in FIG. 3, the third circuit board 324 of the system 300 is attached to the backplane 302 at a position farthest away in the forward direction among the first, second and third circuit boards 304, 306, 324 from the circuit board test control device 330. The light signal redirecting device 342 may include an optical signal receiver 344, configured and aligned to detect light emitted by the optical signal transmitter 338 on the optical communication link represented by the arrow 346. The light signal redirecting device 342 may further include an optical signal transmitter 348 configured for directing light on the optical communication link represented by the arrow 350, toward the optical signal receiver 340 of the circuit board test control device 330. In an example, the first, second and third circuit boards 304, 306, 324 may respectively include apertures represented by the dotted lines 352, 354, 356, suitably aligned and configured for directing light through the circuit boards 304, 306, 324 on the optical communication link represented by the arrow 350. As a further example (not shown), one or more circuit boards 304, 306, 324 of the system 300 may include, aligned with the optical communication link represented by the arrow 350, an optical signal receiver (not shown) and an optical signal transmitter (not shown). An optical signal receiver (not shown) and an optical signal transmitter (not shown) in a circuit board 304, 306, 324 so aligned with the optical communication link represented by the arrow 350 may function as a repeater for re-amplifying a signal being transmitted from the optical signal transmitter 348 to the optical signal receiver 340. As another example (not shown), the optical signal transmitter 348 and the optical signal receiver 344 may be omitted from the light signal redirecting device 342, which may instead include a mirror, two 45 degree mirrors, or retro-reflectors, in each example being suitably configured for redirecting light emitted from the optical signal transmitter 338 to the optical signal receiver 340.

Figure 4:
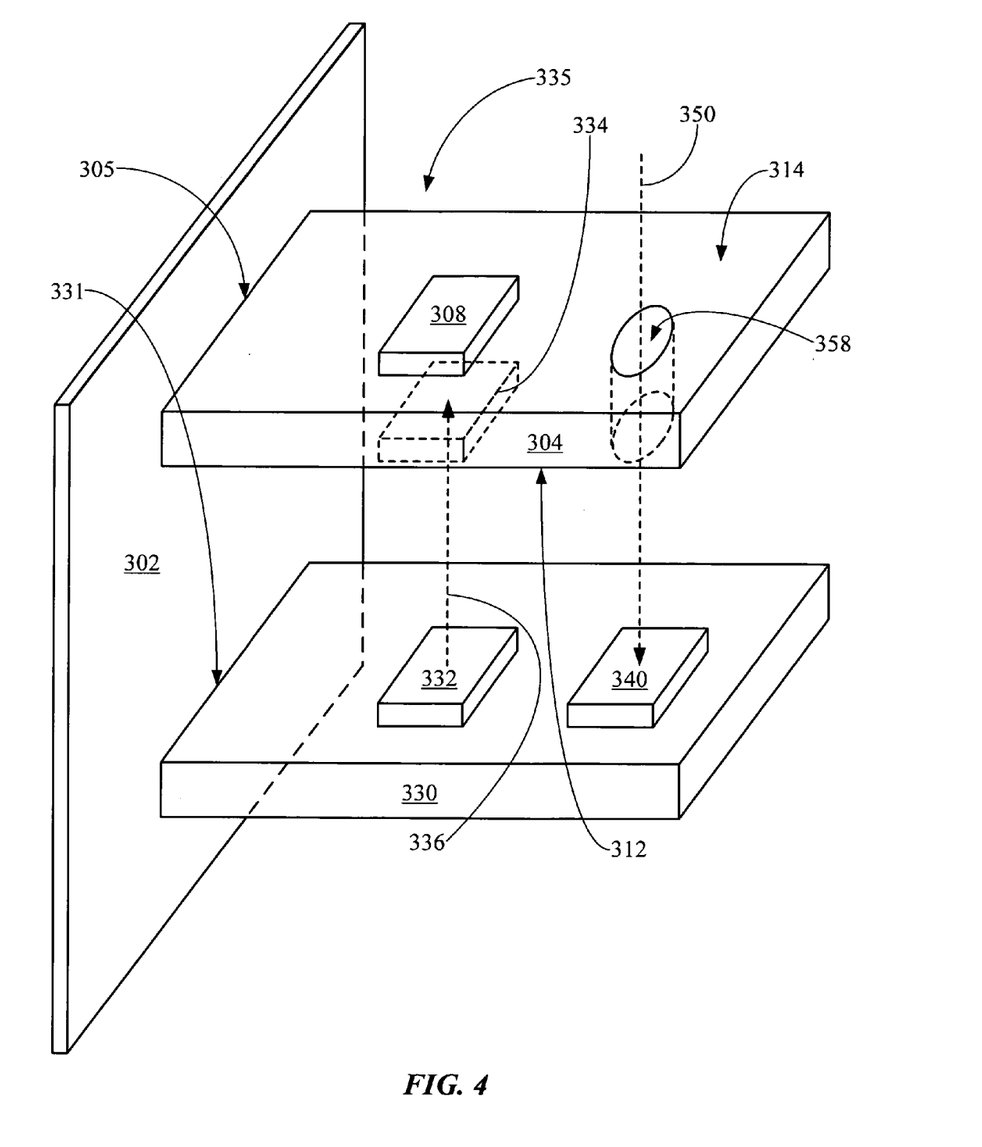
FIG. 4 is a perspective view of the first circuit board, the circuit board test control device, and a part of the backplane, shown in FIG. 3.

In further examples, the system 300 may include additional circuit boards (not shown) attached to the backplane 302. The additional circuit boards may, for example, include optical signal transmitters and optical signal receivers consistent with the discussions of the circuit boards 304, 306, 324 above. It is understood by those skilled in the art that the system 300 may be otherwise configured, modified and adapted consistent with the above teachings regarding the system 100 and as shown in FIGS. 1 and 2. Likewise, it is understood by those skilled in the art that the system 100 may be configured, modified and adapted consistent with the above teachings regarding the system 300 and as shown in FIGS. 3 and 4. Accordingly, the entirety of the discussion herein of the system 100 is deemed incorporated in the discussion of the system 300, and the entirety of the discussion herein of the system 300 is deemed incorporated in the discussion of the system 100.

FIG. 4 is a perspective view of the first circuit board 304, the circuit board test control device 330, and a part of the backplane 302, shown in FIG. 3. The first circuit board 304 may be attached to the backplane 302, for example, by a circuit board connector member (not shown) at a joint 305. In examples, the circuit board test control device 330 may be temporarily or permanently attached to a circuit board shelf for the backplane 302 at a joint 331 by a suitable support (not shown), or otherwise placed in alignment with the first circuit board 304 as shown in FIGS. 3-4. The first circuit board 304 may include the optical signal receiver 334 on the generally planar surface indicated by the arrow 312, and may include the first optical signal transmitter 308 on the generally planar surface indicated by the arrow 314. The circuit board test control device 330 may include the optical signal transmitter 332. The optical signal transmitter 332 and the optical signal receiver 334 may be mutually configured and mutually aligned for circuit board test signal communication from the circuit board test control device 330 to the first circuit board 304 across free space on an optical communication link represented by the arrow 336. The circuit board test control device 330 may also include an optical signal receiver 340. The first circuit board 304 may further include an aperture 358. The aperture 358 and the optical signal receiver 340 may be mutually configured and mutually aligned for circuit board test signal communication from the light signal redirecting device 342 shown in FIG. 3 on the optical communication link represented by the arrow 350 to the optical signal receiver 340.

In an example of operation of the system 300, the circuit board test control device 330 may be secured in position with respect to the first circuit board 304 as shown in FIGS. 3-4. The circuit board test control device 330 may implement test control logic conforming to a selected industry standard, for example, as earlier discussed with respect to the circuit board test control device 136. The circuit board test control device 330 may then be energized and placed in circuit board test signal communication with the circuit boards 304, 306, 324 via the optical signal transmitter 332 and the optical signal receiver 340 in the same manner as earlier discussed in connection with the system 100. In this system 300, the circuit board test signals may, for example, be transmitted into and out of circuitry on the circuit boards 304, 306, 324 only in the forward direction successively on optical communication links represented by the arrows 336, 320, 328, 346 because the circuit boards 304, 306, 324 may not, as shown in FIG. 3 and described above, have access to circuit board test signal inputs in the return direction on the optical communication link represented by the arrow 350. Accordingly, for example, circuit board test signal communication between the circuit board 304 and the circuit board test control device 330 may be required to successively pass in the forward direction through the other circuit boards 306, 324, the signal redirection device 342, and then in the return direction back through all of the circuit board apertures 356, 354, 352 along the optical communication link represented by the arrow 350.

Figure 5:
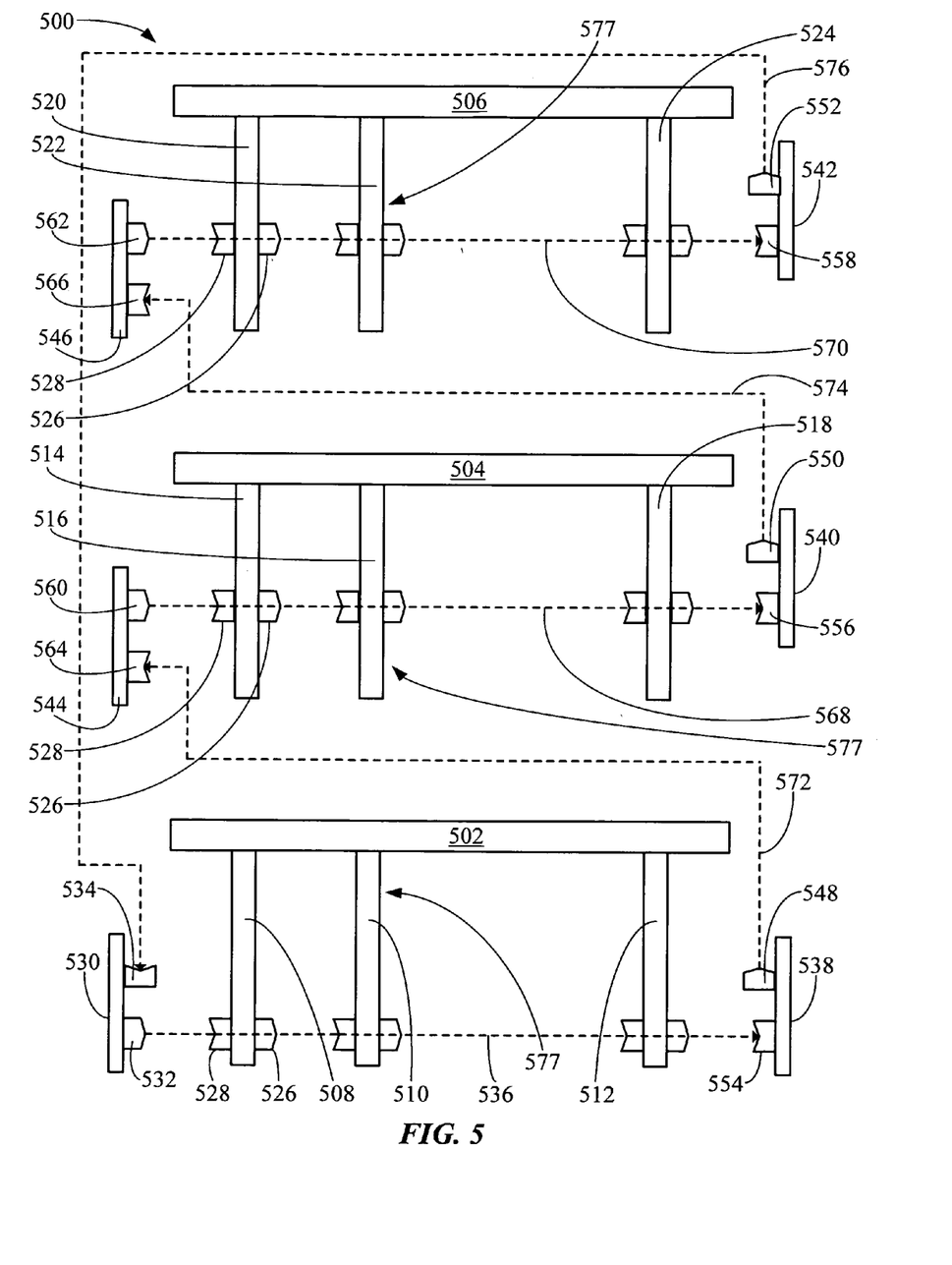
FIG. 5 is a schematic view showing an additional example of a system, including three backplanes.

FIG. 5 is a schematic view showing an additional example 500 of a system, including three backplanes 502, 504, and 506. The backplane 502 may include a plurality of circuit boards 508, 510, 512. The backplane 504 may include a plurality of circuit boards 514, 516, 518. The backplane 506 may include a plurality of circuit boards 520, 522, 524. The circuit boards 508, 510, 512, 514, 516, 518, 520, 522, 524 may each include an optical signal transmitter 526 and an optical signal receiver 528.

The system 500 may include a circuit board test control device 530 having an optical signal transmitter 532 and a signal receiver 534. The optical signal transmitter 532 and the optical signal receiver 528 on the circuit board 508 may be mutually configured and mutually aligned for circuit board test signal communication from the circuit board test control device 530 to the circuit board 508 across free space on an optical communication link represented by the arrow 536. The system 500 may include light signal redirecting devices 538, 540, 542, and signal redirecting devices 544, 546. The light signal redirecting devices 538, 540, 542 may respectively include signal transmitters 548, 550, 552, and may respectively include optical signal receivers 554, 556, 558. The signal redirecting devices 544, 546 may respectively include signal transmitters 560, 562, and may respectively include signal receivers 564, 566.

The optical signal transmitters 532, 526 and the optical signal receivers 554, 528 associated with the backplane 502 may collectively form a communication path in the direction represented by the line 536 from the circuit board test control device 530 to the light signal redirecting device 538. The optical signal transmitters 560, 526 and the optical signal receivers 528, 556 associated with the backplane 504 may collectively form a communication path in the direction represented by the line 568 from the signal redirecting device 544 to the light signal redirecting device 540. The optical signal transmitters 562, 526 and the optical signal receivers 558, 528 associated with the backplane 506 may collectively form a communication path in the direction represented by the line 570 from the signal redirecting device 546 to the light signal redirecting device 542.

The signal transmitters 548, 550, 552 may be mutually configured and mutually aligned for signal transmission to the signal receivers 564, 566, 534, on signal communication links schematically represented by the arrows 572, 574, 576, respectively. For example, the signal transmitters 548, 550, 552 may be optical signal transmitters as earlier discussed; and the signal receivers 564, 566, 534 may be optical signal receivers as earlier discussed. The arrows 572, 574, 576 may then represent, as examples, optical signal communication links including free space paths that may have mirrors and may have other components for changing a direction of an optical signal, or may represent optical fiber links. In another example, the signal transmitters 548, 550, 552 may be electronic signal transmitters and the signal receivers 564, 566, 534 may be electronic signal receivers. For example, the electronic signal transmitters 548, 550, 552 may each include a high speed buffer/driver, and the electronic signal receivers 564, 566, 534 may each include a high speed buffer/receiver. Further, the circuit board test control device 530 and the signal redirecting devices 544, 546 may be configured for converting an electronic signal into an optical signal; and the light signal redirecting devices 538, 540, 542 may be configured for converting an optical signal into an electronic signal. The arrows 572, 574, 576 may then each represent an electronic signal communication link. For example, each of the arrows 572, 574, 576 may represent a high speed signal cable, such as a differential pair cable.

In an example, the system 500 may place the circuit board test control device 530 in circuit board test signal communication with circuit board test circuits 577 that may be included in the circuit boards 508, 510, 512, 514, 516, 518, 520, 522, 524. The circuit board test control device 530 may be configured for bypassing the backplanes 502, 504, 506 in communicating with the circuit boards 508, 510, 512, 514, 516, 518, 520, 522, 524. For example, the optical signal transmitter 532 on the circuit board test circuit device 530 may be configured and aligned with the optical signal receiver 528 on the circuit board 508 for circuit board test signal communication across free space on an optical communication link represented by the arrow 536.

In an example of operation of the system 500, the circuit board test control device 530 may be secured in position with respect to the circuit board 508 as shown in FIG. 5. The signal transmitters 548, 550, 552 may be mutually configured and mutually aligned as earlier discussed, for signal transmission to the signal receivers 564, 566, 534 on signal communication links schematically represented by the arrows 572, 574, 576, respectively. The circuit board test control device 530 may implement test control logic conforming to a selected industry standard, for example, as earlier discussed with respect to the circuit board test control device 136. The circuit board test control device 530 may be energized and placed in circuit board test signal communication with the circuit boards 508, 510, 512, 514, 516, 518, 520, 522, 524 via optical signal transmission from the optical signal transmitter 532 to the optical signal receiver 528 on the circuit board 508 in the same manner as earlier discussed in connection with the systems 100, 300. The circuit board test signal outputs of the circuit board test control device 530 may be successively transmitted through the system 500 on the signal communication links defined by the arrows, 536, 572, 568, 574, 570, 576. Accordingly, the test control logic may be implemented utilizing the circuit board test control device 530, communicating across free space via the optical signal receiver 528 on the circuit board 508 and then with the circuit boards 510, 512, 514, 516, 518, 520, 522, 524.

As another example, the circuit boards 508, 510 may be respectively referred to as the first and second circuit boards on the signal communication link defined by the arrows 536. The system 500 as shown in FIG. 5 facilitates circuit board test signal communication that bypasses the first circuit board 508 and the backplane 502, starting for example from the second circuit board 510 via the signal communication links defined by the arrows 536, 572, 568, 574, 570, 576, back to the circuit board test control device 530.

In another example, the backplanes 502, 504, 506 may be respectively referred to as first, second and third backplanes. The system 500 as shown in FIG. 5 includes first, second and third circuit boards 514, 516, 518 attached to the second backplane 504 and each including an optical signal transmitter 526 and an optical signal receiver 528. The signal communication link 568 includes communication across free space starting for example from the optical signal transmitters 526 in the first and second circuit boards 514, 516 to the optical signal receivers 528 in the second and third circuit boards 516, 518 respectively. The system 500 as shown in FIG. 5 further includes first, second and third circuit boards 520, 522, 524 attached to the third backplane 506 and each including an optical signal transmitter 526 and an optical signal receiver 528. The signal communication link 570 includes communication across free space starting for example from the optical signal transmitters 526 in the first and second circuit boards 520, 522 to the optical signal receivers 528 in the second and third circuit boards 522, 524 respectively.

As an additional example (not shown), the system 500 may be modified by omitting the second and third backplanes 504, 506, and by combining together the signal communication links 572, 576. As further examples (not shown), the system 500 may be modified by omitting the second or third backplane 504, 506, or by adding additional backplanes, and by accordingly configuring signal communication links in a manner analogous to that discussed with regard to the signal communication links of the system 500 defined by the arrows 536, 572, 568, 574, 570, 576 shown in FIG. 5. Further, for example (not shown), the system 500 may be modified by making a mutual substitution between the positions in the system 500 of the circuit board test control device 530 and one of the signal redirecting devices 544, 546, and by accordingly reconfiguring the signal communication links defined by the arrows 536, 572, 568, 574, 570, 576 for routing of circuit board test control signals through all of the circuit boards 508, 510, 512, 514, 516, 518, 520, 522, 524 in the system 500.

It is understood by those skilled in the art that the system 500 may be otherwise configured, modified and adapted consistent with the above teachings regarding the systems 100 and 300 and as shown in FIGS. 1-4. Likewise, it is understood by those skilled in the art that the systems 100, 300 may be configured, modified and adapted consistent with the above teachings regarding the system 500 and as shown in FIG. 5. Accordingly, the entirety of the discussion herein of each of the systems 100, 300, 500 is deemed incorporated in the discussions of all of the systems 100, 300, 500.

Figure 6:
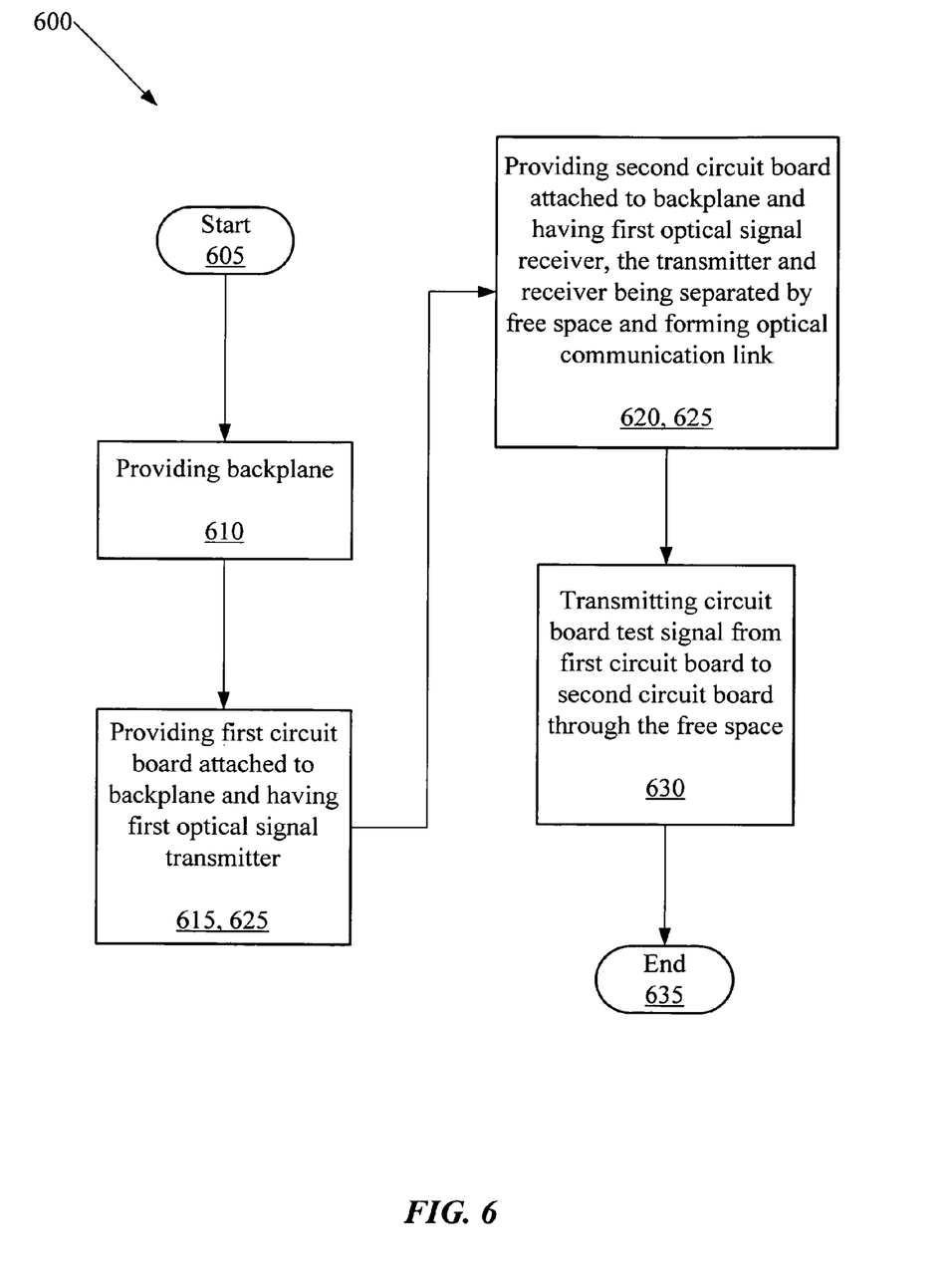
FIG. 6 is a flow chart showing an example of an implementation of a method.

FIG. 6 is a flow chart showing an example of an implementation of a method 600. The method starts at step 605, and then at step 610 a backplane 102, 302, 502, 504, 506 is provided. Step 615 includes providing a first circuit board 104, 304, 508, 514, 520 having a first optical signal transmitter 108, 308, 536. In step 620, a second circuit board 106, 306, 510, 516, 522 is provided, having a first optical signal receiver 110, 310, 528. Step 625 includes attaching the first circuit board 104, 304, 508, 514, 520 and the second circuit board 106, 306, 510, 516, 522 to the backplane 102, 302, 502, 504, 506. At step 630, the first optical signal transmitter 108, 308, 526 and the first optical signal receiver 110, 310, 528 are mutually configured and mutually aligned for circuit board test signal communication from the first circuit board 104, 304, 508, 514, 520 to the second circuit board 106, 306, 510, 516, 522 across free space. The method 600 may then end at step 635.

In an example, providing the second circuit board 106, 306, 510, 516, 522 at step 620 may include providing a second optical signal transmitter 122, 322, 526. Step 620 may further include providing a third circuit board 124, 324, 512, 518, 524 having a second optical signal receiver 126, 326, 528. Step 625 may then include attaching the third circuit board 124, 324, 512, 518, 524 to the backplane 102, 302, 502, 504, 506. Step 630 may then include mutually configuring and mutually aligning the second optical signal transmitter 122, 322, 526 and the second optical signal receiver 126, 326, 528 for circuit board test signal communication from the second circuit board 106, 306, 510, 516, 522 to the third circuit board 124, 324, 512, 518, 524 across free space.

As another example, providing the second circuit board 106, 306, 510, 516 522 at step 620 may include providing a third optical signal transmitter 130. In that example, providing the first circuit board 104, 304, 508, 514, 520 at step 615 may include providing a third optical signal receiver 132. Step 630 may then include mutually configuring and mutually aligning the third optical signal transmitter 130 and the third optical signal receiver 132 for circuit board test signal communication from the second circuit board 106, 306, 510, 516, 522 to the first circuit board 104, 304, 508, 514, 520 across free space.

In a further example, providing the first circuit board 104, 304, 508, 514, 520 at step 615 may include providing a first circuit board test circuit 135, 137, 335, 337, 339, 577 configured to be in circuit board test signal communication with the first optical signal transmitter 108, 308, 526 and configured for testing the first circuit board 104, 304, 508, 514, 520. In that example, providing the second circuit board 106, 306, 510, 516, 522 at step 620 may include providing a second circuit board test circuit 135, 137, 335, 337, 339, 577 configured to be in circuit board test signal communication with the first optical signal receiver 110, 310, 528 and configured for testing the second circuit board 106, 306, 510, 516, 522. That example may additionally include, at step 615, establishing circuit board test signal communication between a circuit board test control device 136, 330, 530 and the first circuit board test circuit 135, 137, 335, 337, 339, 577, including bypassing the backplanes 102, 302, 502, 504, 506. That example may further include, at step 620, establishing circuit board test signal communication between the circuit board test control device 136, 330, 530 and the second circuit board test circuit 135, 137, 335, 337, 339, 577, including bypassing the backplanes 102, 302, 502, 504, 506. Further in that same example, providing the circuit board test control device 136, 330, 530 at step 615 may include providing a fourth optical signal transmitter 138, 332, 532 on the circuit board test control device 136, 330, 530, and providing a fourth optical signal receiver 140, 334, 528 on the first circuit board 104, 304, 508, 514, 520. Step 630 may then include mutually configuring and mutually aligning the fourth optical signal transmitter 138, 332, 532 and the fourth optical signal receiver 140, 334, 528 for circuit board test signal communication from the circuit board test control device 136, 330, 530 to the first circuit board 104, 304, 508, 514, 520 across free space. Additionally in that same example, providing the circuit board test control device 136, 330, 530 at step 615 may include providing a fifth optical signal receiver 146, 340, 534. In that example, providing the first circuit board 104, 304, 508, 514, 520 at step 615 then may also include providing either an aperture 358 or a fifth optical signal transmitter 144. Step 630 may then include mutually configuring and mutually aligning the aperture 358 or the fifth optical signal transmitter 144 with the fifth optical signal receiver 146, 340, 534 for circuit board test signal communication from the first circuit board 104, 304, 508, 514, 520 to the circuit board test control device 136, 330, 530 across free space.

The systems 100, 300, 500 may, for example, be utilized as systems for carrying out boundary scan testing of circuit boards 104, 106, 124, 304, 306, 324, 508, 510, 512, 514, 516, 518, 520, 522, 524 or of circuit boards attached to a backplane 102, 302, 502, 504, 506. The systems 100, 300, 500 may include or may not include a circuit board test control device 136, 330, 530. Likewise, the method 600 may be utilized in connection with configuring and with operating a system 100, 300, 500. While the foregoing description refers in some instances to the systems 100, 300, 500, it is appreciated that the subject matter is not limited to these systems, nor to the systems discussed in the specification. Systems having other configurations consistent with the foregoing teachings may be fabricated. Likewise, the method 600 may be performed utilizing any system 100, 300, 500 having a first optical signal transmitter 108, 308, 526 and a first optical signal receiver 110, 310, 528 that are mutually configured and mutually aligned in accordance with the foregoing teachings for circuit board test signal communication from the first circuit board 104, 304, 508, 514, 520 to the second circuit board 106, 306, 510, 516, 522 across free space. Further, it is understood by those skilled in the art that the method 600 may include additional steps and modifications of the indicated steps.

Moreover, it will be understood that the foregoing description of numerous examples has been presented for purposes of illustration and description. This description is not exhaustive and does not limit the claimed invention to the precise forms disclosed. Modifications and variations are possible in light of the above description or may be acquired from practicing the invention. The claims and their equivalents define the scope of the invention.

The invention claimed is:

1. A system, comprising:
   a backplane;
   a first circuit board having a first optical signal transmitter and being attached to the backplane, wherein the first circuit board includes a first circuit board boundary scan test circuit configured for testing the first circuit board and for communicating circuit board boundary scan test signals with the first optical signal transmitter;
   a second circuit board having a first optical signal receiver and being attached to the backplane, and wherein the second circuit board includes a second circuit board boundary scan test circuit configured for testing the second circuit board and for communicating circuit board boundary scan test signals with the first optical signal receiver;
   wherein the first optical signal transmitter and the first optical signal receiver are connected by a free-space optical communication link and are configured to communicate circuit board boundary scan test signals on the free-space optical communication link.

2. The system of claim 1, wherein the second circuit board includes a third optical signal transmitter and the first circuit board includes a third optical signal receiver, and wherein the third optical signal transmitter and the third optical signal receiver are connected by free-space optical communication link and are configured to communicate circuit board boundary scan test signals on the another free-space optical communication link.

3. The system of claim 1, including a circuit board boundary scan test control device, being separated by free space from the first and second circuit boards; wherein the circuit board boundary scan test control device and the first circuit board are connected by another free-space optical communication link and are configured to communicate circuit board boundary scan test signals on the another free-space optical communication link.

4. The system of claim 3, wherein the circuit board boundary scan test control device includes a fourth optical signal transmitter and the first circuit board includes a fourth optical signal receiver, and wherein the fourth optical signal transmitter and the fourth optical signal receiver are connected by another free-space optical communication link and are configured to communicate circuit board boundary scan test signals on the another free-space optical communication link.

5. The system of claim 3, wherein the first circuit board includes an aperture, wherein the second circuit board includes a third optical signal transmitter, wherein the circuit board boundary scan test control device includes a fifth optical signal receiver, and wherein the third optical signal transmitter and the fifth optical signal receiver are connected by another free-space optical communication link and are configured to communicate circuit board boundary scan test signals through the aperture on the another free-space optical communication link.

6. The system of claim 3, including a signal communication link, wherein the signal communication link includes another free-space optical communication link connecting the second circuit board with the circuit board boundary scan test control device, and wherein the signal communication link is configured to communicate circuit board boundary scan test signals on the another free-space optical communication link.

7. The system of claim 6, including a second backplane, a third circuit board including a second optical signal transmitter and being attached to the second backplane, and a fourth circuit board including a second optical signal receiver and being attached to the second backplane, wherein the signal communication link includes another free-space optical communication link connecting the second optical signal transmitter with the second optical signal receiver, and wherein the signal communication link is configured to communicate circuit board boundary scan test signals on the another free-space optical communication link.

8. The system of claim 3, wherein the first circuit board includes a fifth optical signal transmitter and the circuit board boundary scan test control device includes a fifth optical signal receiver, and wherein the fifth optical signal transmitter and the fifth optical signal receiver are connected by another free-space optical communication link and are configured to communicate circuit board boundary scan test signals on another free-space optical communication link.

9. A method, comprising:
providing a backplane having attached thereto a first circuit board and a second circuit board, wherein the first circuit board includes a first optical signal transmitter, wherein the first circuit board includes a first circuit board boundary scan test circuit that is in signal communication with the first optical signal transmitter, wherein the second circuit board includes a first optical signal receiver, wherein the second circuit board includes a second circuit board boundary scan test circuit that is in signal communication with the first optical signal receiver, and wherein the first optical signal transmitter and the first optical signal receiver are connected by a free-space optical communication link; and
transmitting circuit board boundary scan test signals on the free-space optical communication link.

10. The method of claim 9, wherein providing the second circuit board includes providing a third optical signal transmitter, wherein providing the first circuit board includes providing a third optical signal receiver, the third optical signal transmitter and the third optical signal receiver being connected by another free-space optical communication link; and
transmitting circuit board boundary scan test signals on the another free-space optical communication link.

11. The method of claim 9, wherein providing the backplane and the first and second circuit boards further includes providing a circuit board boundary scan test control device that is separated by free space from the first and second circuit boards; and wherein the circuit board boundary scan test control device and the first circuit board are connected by another free-space optical communication link; and wherein transmitting circuit board boundary scan test signals includes transmitting circuit board boundary scan test signals on the another free space optical communication link.

12. A system, comprising:
a backplane;
a first circuit board having a first optical signal transmitter and being attached to the backplane;
a second circuit board having a first optical signal receiver and being attached to the backplane; and
a circuit board boundary scan test control device, the circuit board boundary scan test control device being separated by free space from the first and second circuit boards;
wherein the circuit board boundary scan test control device and the first circuit board are connected by a free-space optical communication link and are configured to communicate circuit board boundary scan test signals on the free-space optical communication link; and
wherein the first optical signal transmitter and the first optical signal receiver are connected by another free-space optical communication link and are configured to communicate circuit board boundary scan test signals on the another free-space optical communication link.

13. The system of claim 12, wherein the second circuit board includes a third optical signal transmitter and the first circuit board includes a third optical signal receiver, and wherein the third optical signal transmitter and the third optical signal receiver are connected by another free-space optical communication link and are configured to communicate circuit board boundary scan test signals on the another free-space optical communication link.

14. The system of claim 12, wherein the circuit board boundary scan test control device includes a fourth optical signal transmitter and the first circuit board includes a fourth optical signal receiver, and wherein the fourth optical signal transmitter and the fourth optical signal receiver are connected by another free-space optical communication link and are configured to communicate circuit board boundary scan test signals on the another free-space optical communication link.

15. The system of claim 12, wherein the first circuit board includes a fifth optical signal transmitter and the circuit board boundary scan test control device includes a fifth optical signal receiver, and wherein the fifth optical signal transmitter and the fifth optical signal receiver are connected by another free-space optical communication link and are configured to communicate circuit board boundary scan test signals on the another free-space optical communication link.

16. The system of claim 12, wherein the first circuit board includes an aperture, wherein the second circuit board includes a third optical signal transmitter, wherein the circuit board boundary scan test control device includes a fifth optical signal receiver, and wherein the third optical signal transmitter and the fifth optical signal receiver are connected by another free-space optical communication link and are configured to communicate circuit board boundary scan test signals through the aperture on the another free-space optical communication link.

17. The system of claim 12, including a signal communication link, wherein the signal communication link includes another free-space optical communication link connecting the second circuit board with the circuit board boundary scan test control device, and wherein the signal communication link is configured to communicate circuit board boundary scan test signals on the another free-space optical communication link.

18. The system of claim 17, including a second backplane, a third circuit board including a second optical signal transmitter and being attached to the second backplane, and a fourth circuit board including a second optical signal receiver and being attached to the second backplane, wherein the signal communication link includes another free-space optical communication link connecting the second optical signal transmitter with the second optical signal receiver, and wherein the signal communication link is configured to communicate circuit board boundary scan test signals on the another free-space optical communication link.

19. A method, comprising:
providing a backplane having attached thereto a first circuit board and a second circuit board, and a circuit board boundary scan test control device that is separated by free space from the first and second circuit boards, wherein the first circuit board includes a first optical signal transmitter and the second circuit board includes a first optical signal receiver, wherein the first optical signal transmitter and the first optical signal receiver are connected by a free-space optical communication link, and wherein the circuit board boundary scan test control device and the first circuit board are connected by another free-space optical communication link; and
transmitting circuit board boundary scan test signals on the free-space optical communication link and on the another free-space optical communication link.

20. The method of claim 19, wherein providing the second circuit board includes providing a third optical signal transmitter, wherein providing the first circuit board includes providing a third optical signal receiver, the third optical signal transmitter and the third optical signal receiver being connected by another free-space optical communication link; and transmitting circuit board boundary scan test signals on the another free-space optical communication link.

21. The method of claim 19, wherein providing the circuit board boundary scan test control device includes providing a fourth optical signal transmitter, wherein providing the first circuit board includes providing a fourth optical signal receiver, wherein the fourth optical signal transmitter and the fourth optical signal receiver are connected by another free-space optical communication link; and transmitting circuit board boundary scan test signals on the another free-space optical communication link.

22. The method of claim 19, wherein providing the first circuit board includes providing a fifth optical signal transmitter, wherein providing the circuit board boundary scan test control device includes providing a fifth optical signal receiver, wherein the firth optical signal transmitter and the fifth optical signal receiver are connected by another free-space optical communication link; and transmitting circuit board boundary scan test signals on the another free-space optical communication link.

23. The method of claim 19, wherein providing the first circuit board includes providing an aperture, wherein providing the second circuit board includes providing a third optical signal transmitter, wherein providing the circuit board boundary scan test control device includes providing a fifth optical signal receiver, wherein the third optical signal transmitter and the fifth optical signal receiver are connected by a another free-space optical communication link; and transmitting circuit board boundary scan test signals through the aperture on the another free-space optical communication link.

\* \* \* \* \*